(12) United States Patent
Watanabe

(10) Patent No.: US 7,879,714 B2
(45) Date of Patent: Feb. 1, 2011

(54) SEMICONDUCTOR DEVICE MANUFACTURING METHOD

(75) Inventor: Kiyonori Watanabe, Tokyo (JP)

(73) Assignee: Oki Semiconductor Co., Ltd., Tokyo (JP)

( * ) Notice: Subject to any disclaimer, the term of this patent is extended or adjusted under 35 U.S.C. 154(b) by 0 days.

(21) Appl. No.: 12/320,241

(22) Filed: Jan. 22, 2009

(65) Prior Publication Data
US 2009/0215258 A1 Aug. 27, 2009

(30) Foreign Application Priority Data
Feb. 22, 2008 (JP) .............................. 2008-042207

(51) Int. Cl.
*H01L 21/44* (2006.01)
(52) U.S. Cl. ................ 438/613; 438/614; 257/E21.585

(58) Field of Classification Search ................. 438/613, 438/614
See application file for complete search history.

(56) References Cited

FOREIGN PATENT DOCUMENTS

JP    2005-038979    2/2005

*Primary Examiner*—Alexander G Ghyka
(74) *Attorney, Agent, or Firm*—Rabin & Berdo, PC

(57) ABSTRACT

There is provide a semiconductor device manufacturing method, including: preparing a substrate; laminating an insulation layer on the substrate; laminating a first underlying metal layer on the insulation layer; forming rewiring on the first underlying metal layer; removing exposed portions of the first underlying metal layer; laminating a second underlying metal layer on the rewiring and the insulation layer; forming a column electrode on the rewiring via the second underlying metal layer; and removing exposed portions of the second underlying metal layer.

8 Claims, 10 Drawing Sheets

SEMICONDUCTOR DEVICE MANUFACTURING METHOD

CROSS-REFERENCE TO RELATED APPLICATION

This application claims priority under 35 USC 119 from Japanese Patent Application No. 2008-042207, the disclosure of which is incorporated by reference herein.

BACKGROUND OF THE INVENTION

1. Field of the Invention

The present invention relates to a semiconductor device manufacturing method, and in particular, a method for manufacturing a small semiconductor device, represented by a wafer level chip scale package (WCSP).

2. Description of Related Art

In an integrated circuit package in which semiconductor elements such as a semiconductor integrated circuit are packaged, demand for miniaturization and thinning is increasing. Recently, WCSP (Wafer Level Chip Scale Packaging), in which ball-shaped terminals are arranged in a grid on the surface of a semiconductor element, has been promoted, mainly in the field of semiconductor integrated circuit packaging, in which thinning is particularly demanded. As this semiconductor device manufacturing method, a manufacturing method has been proposed in which rewiring is provided on a silicon wafer on which a pad electrode, an interlayer insulation film, and an underlying metal layer have been sequentially formed, and forming a column electrode on the surface of the rewiring; the underlying metal layer is subsequently removed, and resin sealing is performed (see Japanese Patent Application Laid-Open (JP-A) No. 2005-38979).

However, in recent years, as a result of increasing demand to further miniaturize wafer level chip scale packages, the width and spacing of internal rewiring has decreased, and demands for reducing allowed values for outer dimensions have increased. In a conventional processing method, when an underlying metal layer is removed by, for example, etching, rewiring is also eroded. Further, if a post electrode having a height of 100 μm or more above the wafer surface is present, the flow of etching liquid at the wafer surface is not uniform. As a result, variations in etching rate at the wafer surface occur, which may cause irregularities in the shape of rewiring, and thus in a conventional process method, it has not been possible to satisfy allowed values for outer dimensions. Moreover, when excessive etching is performed in order to prevent the generation of etching residue, since rewiring is also etched, irregularities in rewiring become even greater, which is problematic. These problems are explained in detail below with reference to FIGS. 7-10.

FIGS. 7A-10 are sectional views of a conventional semiconductor device manufacturing method. First, as shown in FIG. 7A, aluminum (Al) electrode pad 103 is formed on oxidation film 102 which itself is formed on semiconductor substrate 101. After forming surface protection film 104 and interlayer insulation film 105, a through hole is opened above electrode pad 103.

Next, as shown in FIG. 7B, on the surface of electrode pad 103 and interlayer insulation film 105, underlying metal adhesive layer 106, formed from Ti or the like, and underlying metal antioxidant layer 107, formed from Cu or the like, are sequentially laminated by a sputter method or the like.

Subsequently, as shown in FIG. 7C, a photosensitive resin layer is covered over the entire surface, and a developing process for pattern-forming and pattern-opening of the photosensitive resin layer is performed, forming a pattern of photosensitive resin film 108. Next, taking underlying metal antioxidant layer 107 as a common electrode, copper is electrodeposited in an electroplating method to form rewiring 109 which extends from electrode pad Al 103 to a portion forming a copper column electrode (described below).

Next, as shown in FIG. 8A, photosensitive resin film 108 is removed by dissolving or the like, and as shown in FIG. 8B, photosensitive resin film 110 is adhered over the entire surface of underlying metal antioxidant layer 107, and a hole portion for forming column electrode 111 is formed by an exposing and developing process. Then, taking underlying metal antioxidant layer 107 as a common electrode, column electrode 111 is formed by electrodepositing copper in an electroplating method.

As shown in FIG. 8C, photosensitive resin film 110 is removed by dissolving or the like, and underlying metal antioxidant layer 107 and underlying metal adhesive layer 106 are removed by etching at an appropriate time. Finally, as shown in FIG. 9, a sealing resin 112 is formed such that the surface of column electrode 111 is exposed, and a soldering terminal 113 is formed by a reflow process on column electrode 111. The wafer is diced into pieces and a semiconductor device like that shown in FIG. 10A is manufactured.

In the above semiconductor device manufacturing method according to conventional techniques, when underlying metal antioxidant layer 107 and underlying metal adhesive layer 106 are removed in the process performed between FIG. 8B and FIG. 8C, since the flow of an etching liquid is not uniform due to column electrode 111, irregularities occur in etching.

SUMMARY OF THE INVENTION

The present invention has been achieved in consideration of the above problems, and takes as an aim to suppress variations in the conductivity of rewiring due to irregularities in the shape of the rewiring, and provide a method of producing a high quality semiconductor device.

The present inventors have through their efforts succeeded in achieving the above aim and addressing the above problems by using the semiconductor device manufacturing method described below.

The semiconductor device manufacturing method according to the first aspect of the present invention includes:

preparing a substrate;

laminating an insulation layer on the substrate;

laminating a first underlying metal layer on the insulation layer;

forming rewiring on the first underlying metal layer;

removing exposed portions of the first underlying metal layer;

laminating a second underlying metal layer on the rewiring and the insulation layer;

forming a column electrode on the rewiring via the second underlying metal layer; and removing exposed portions of the second underlying metal layer.

According to the semiconductor device manufacturing method of the first embodiment of the present invention, since etching of the first underlying metal layer is performed before a column electrode is formed, non-uniformity of the flow of an etching liquid when a column electrode is present is suppressed, and it is possible to perform etching of the first underlying metal layer without irregularities. As a result, even if an edge portion of rewiring is etched, each portion is etched in the same manner, and it is possible to keep irregularities in the shape of the rewiring to within an allowable range, thereby increasing semiconductor device yield. Moreover, since a second underlying metal layer covers the rewiring, even if a column electrode is formed, it is possible to suppress excessive etching of rewiring, which is a contributing factor to a non-uniform flow of etching liquid, and the quality of a semiconductor device can be improved.

In the second aspect of the present invention, the second underlying metal layer comprises an underlying metal adhesive layer and an underlying metal antioxidant layer.

In the third aspect of the present invention, the first underlying metal layer comprises an underlying metal adhesive layer and an underlying metal antioxidant layer.

According to the second and third embodiments of the semiconductor device manufacturing method of the present invention, due to a two layer structure of an underlying metal adhesive layer and an underlying metal antioxidant layer, it is possible to prevent oxidizing of an underlying metal adhesive layer.

In the fourth aspect of the present invention, the second underlying metal layer is laminated to an extent that the column electrode can be formed by electroplating.

In the fifth aspect of the present invention, the thickness of the second underlying metal layer is from 0.4 µm to 1.0 µm.

According to the fourth and fifth embodiments of the semiconductor device manufacturing method of the present invention, it is possible to adequately form an underlying metal adhesive layer even at a cutaway portion of a semiconductor device. In other words, even at a corner of an end portion of an underlying metal adhesive layer, an underlying metal adhesive layer of adequate thickness can be formed, and thereby, a column electrode can be formed at a uniform height from a semiconductor wafer.

According to the sixth aspect of the present invention, there is provided a semiconductor device manufacturing method, including:

preparing a substrate;

laminating an insulation layer on the substrate;

sequentially laminating an underlying metal adhesive layer and an underlying metal antioxidant layer on the insulation layer;

forming rewiring on the underlying metal antioxidant layer;

removing exposed portions of the underlying metal antioxidant layer;

forming a column electrode on the rewiring; and removing exposed portions of the underlying metal adhesive layer.

According to the sixth embodiment of the semiconductor device manufacturing method of the present invention, the quality of a semiconductor device can be improved, using a similar number of processes as a conventional manufacturing method, simply by changing the order of the processes. Further, since etching of an underlying metal antioxidant layer is performed before a column electrode is formed, the flow of an etching liquid becomes uniform, and it is possible to keep irregularities in the shape of the rewiring to within an allowable range, thereby improving the quality of a semiconductor device. Moreover, even if an underlying metal adhesive layer is etched, since rewiring is not etched, even if the flow of an etching liquid is non-uniform due to a column electrode, it is possible to etch an underlying metal adhesive layer such that etching residue does not remain. As a result, irregularities in rewiring are suppressed, and the quality of a semiconductor device can be improved.

In the seventh aspect of the present invention, the underlying metal adhesive layer in the sixth aspect of the invention is laminated to an extent that the column electrode can be formed by electroplating.

In the eighth aspect of the present invention, the thickness of the underlying metal adhesive layer in the sixth aspect of the invention is from 0.4 µm to 1.0 µm.

According to the seventh and eighth embodiments of the semiconductor device manufacturing method of the present invention, it is possible to adequately form an underlying metal adhesive layer even at a cutaway portion of a semiconductor device. In other words, even at a corner of an end portion of an underlying metal adhesive layer, an underlying metal adhesive layer of adequate thickness can be formed, and thereby, when a column electrode is formed, it can be formed at a uniform height from a semiconductor wafer.

As described above, according to the present invention, a method that suppresses changes in the conductivity of rewiring due to irregularities in the shape of the rewiring and by which a high quality semiconductor device can be manufactured is provided.

BRIEF DESCRIPTION OF THE DRAWINGS

Preferred exemplary embodiments of the present invention will be described in detail based on the following figures, wherein.

DETAILED DESCRIPTION OF THE INVENTION

Figure 1A:
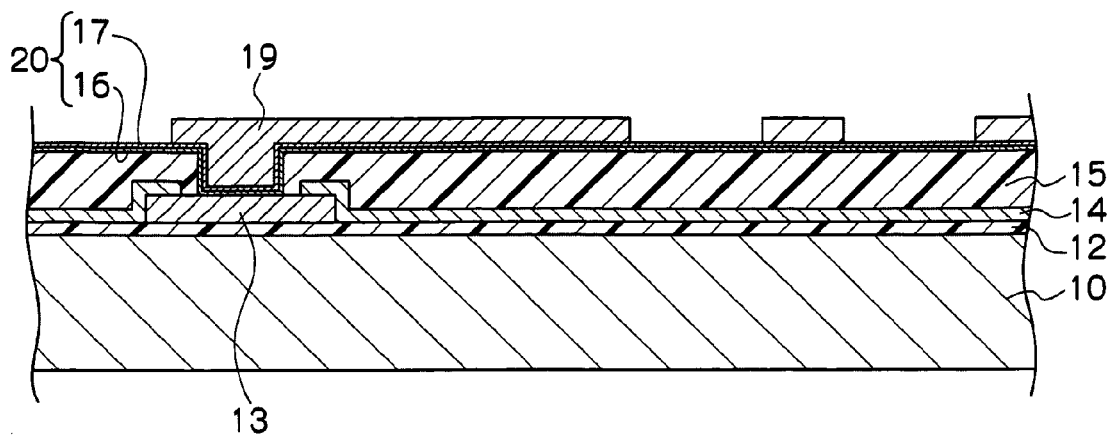
FIGS. 1A-1C are sectional views of processes from a process of forming rewiring to a process of forming a second underlying metal layer, in the semiconductor device manufacturing method according to the first embodiment of the present invention.

Embodiments of the present invention are described below with reference to the drawings. In the drawings, the shapes, sizes, and positional relationships of the constituent elements are indicated schematically only to the extent that they may be understood, and the present invention is not limited thereby. The following explanations may include specific materials, conditions, values and the like, but these are merely preferable examples, and the present invention is not limited thereby.

First Embodiment

The semiconductor device manufacturing method according to the first embodiment of the present invention includes: preparing a substrate; laminating an insulation layer on the substrate; laminating a first underlying metal layer on the insulation layer; forming rewiring on the first underlying metal layer; removing exposed portions of the first underlying metal layer; laminating a second underlying metal layer on the rewiring and the insulation layer; forming a column electrode on the rewiring via the second underlying metal layer; and removing exposed portions of the second underlying metal layer. Each of the above is explained below with reference to FIGS. 1A-3.

Preparing Substrate and Forming Rewiring

Figure 7A:
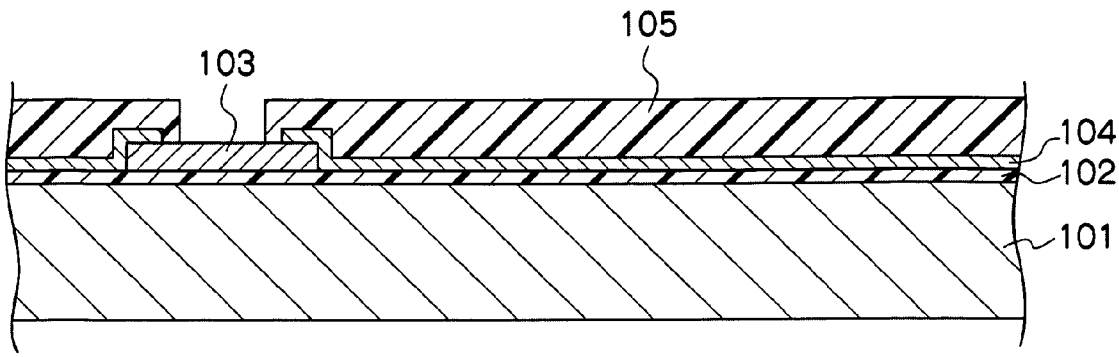
FIGS. 7A-7C are sectional views of processes from a process of forming an interlayer insulation film to a process of forming rewiring.
Figure 7B:
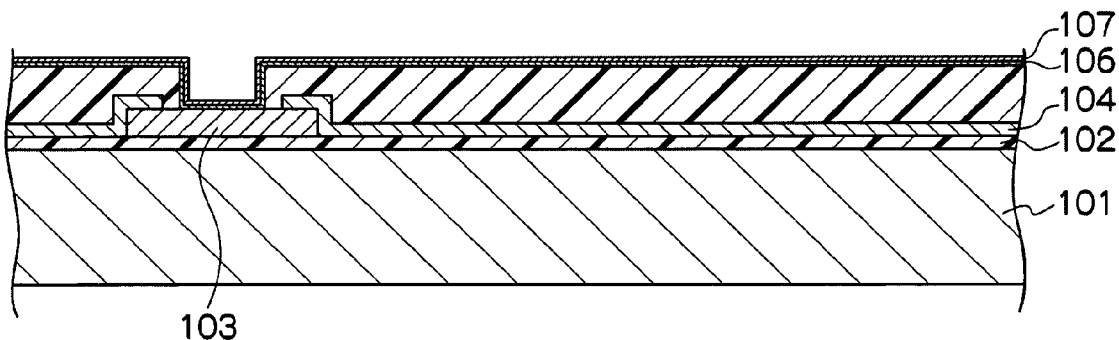
Figure 7C:
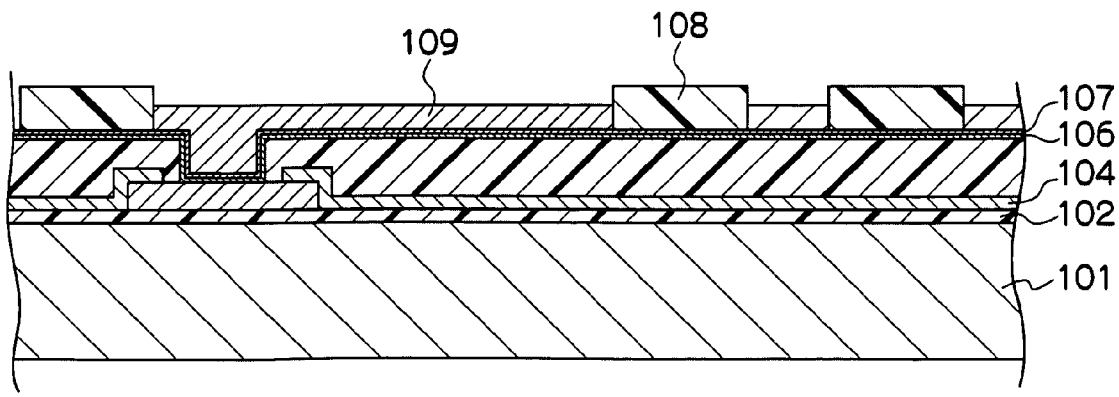
Figure 8A:
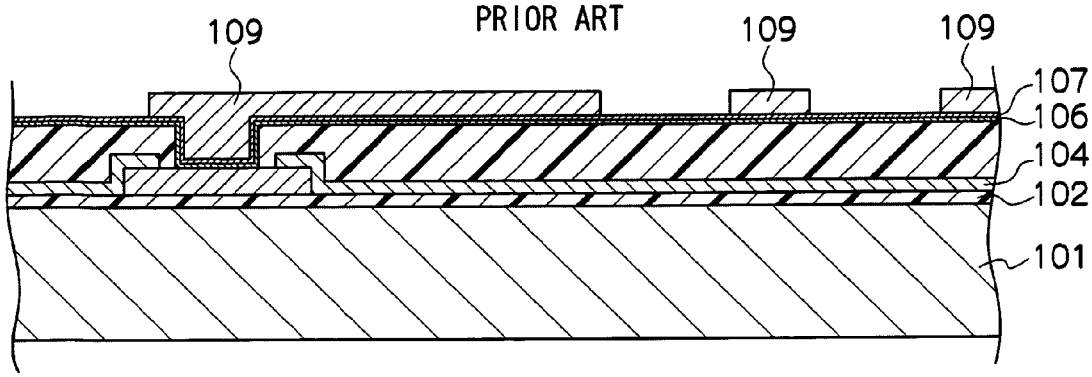
FIGS. 8A-8C are sectional views of processes from a process of forming a photosensitive resin film to a process of etching an underlying metal layer in a conventional semiconductor device manufacturing method.
Figure 8B:
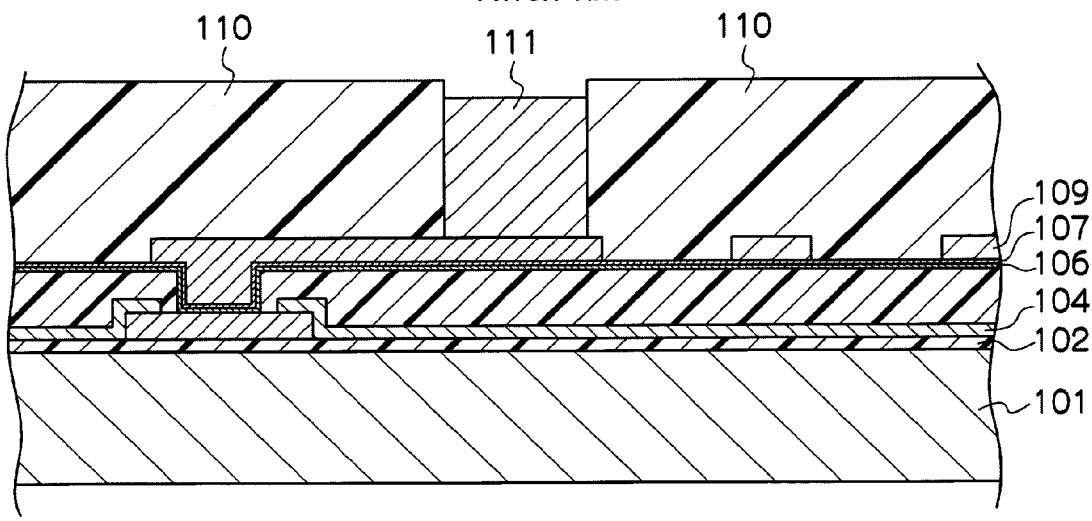
Figure 8C:
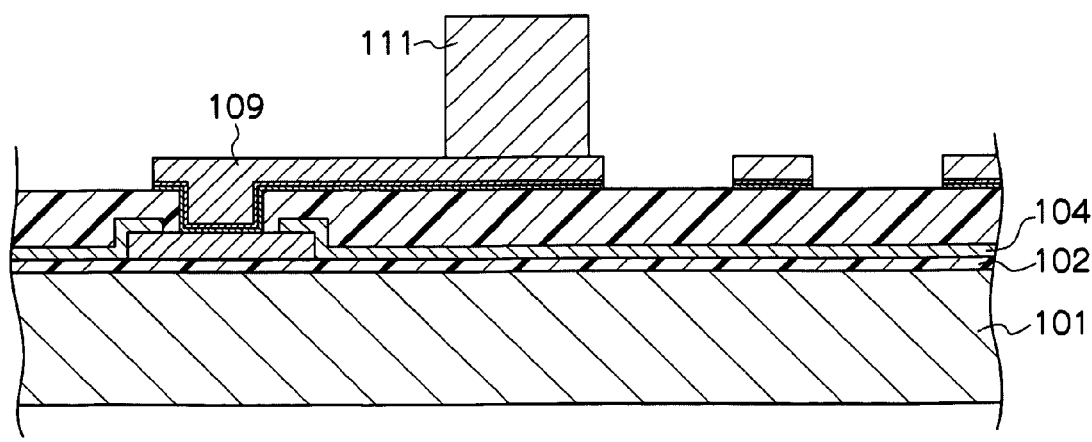
Figure 9:
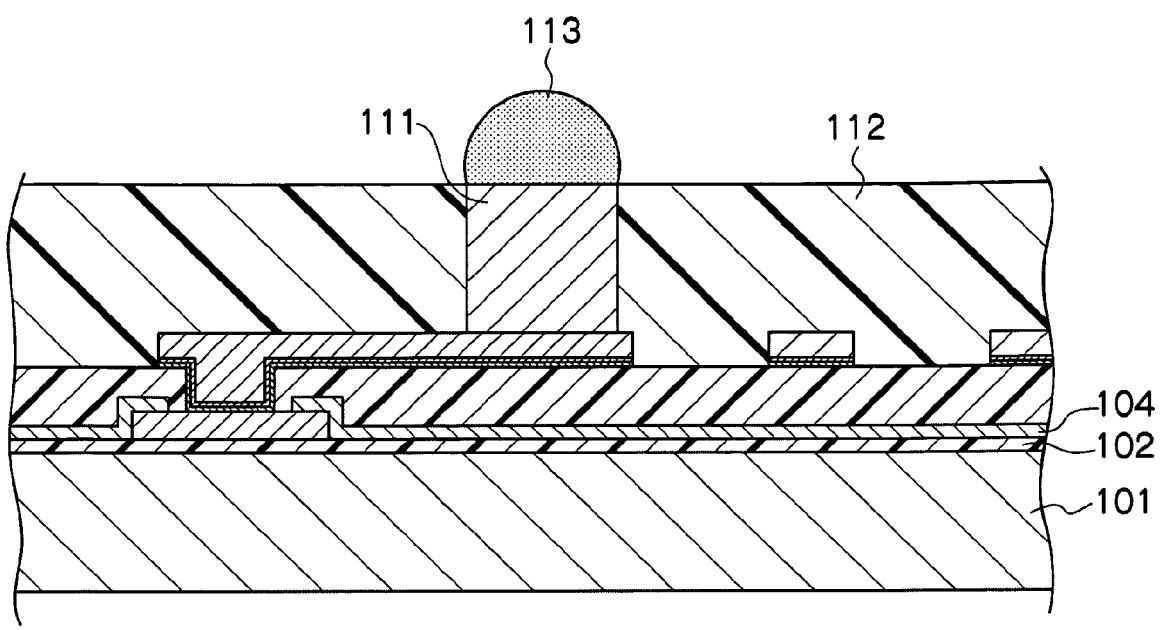
FIG. 9 is a sectional view of a process of forming a soldering electrode in a conventional semiconductor device manufacturing method.
Figure 10:
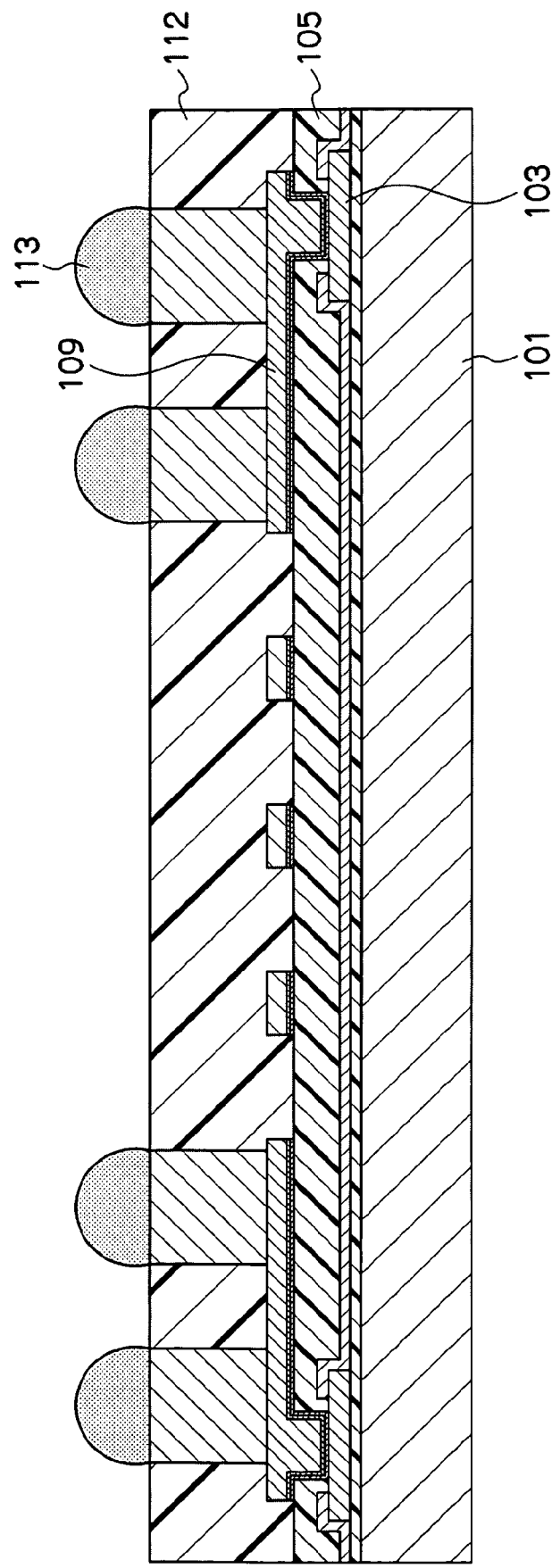
FIG. 10 is a sectional view of a semiconductor device manufactured by a conventional semiconductor device manufacturing method.

In the semiconductor device manufacturing method of the present invention, rewiring 19, similar to that shown in FIG. 1A, is formed by a conventional technique similar to that shown in FIGS. 7A-7C.

First, similar to as shown in FIG. 7A, a substrate 10 formed with an insulation layer 12 is prepared. An electrode pad 13 is then formed on insulation layer 12. A surface protection film 14 and an insulation layer 15 (interlayer insulation film) are formed thereon, and subsequently a through hole is opened above electrode pad 13.

Next, similar to as shown in FIG. 7B, above electrode pad 13 and on the surface of insulation layer 15, underlying metal adhesive layer 16, formed from Ti or the like, and underlying metal antioxidant layer 17, formed from Cu or the like, are sequentially laminated by a sputter method or the like.

Subsequently, similar to as shown in FIG. 7C, a photosensitive resin layer (not shown) is covered over the entire surface, and pattern exposure and development are performed to form a pattern of photosensitive resin layer 108. Next, taking underlying metal antioxidant layer 17 as a common electrode, copper is electrodeposited in an electroplating method to form rewiring 19 which extends from electrode pad 13 to a portion forming a copper column electrode (described below).

As shown in FIG. 1A, photosensitive resin film 18 is removed, exposing underlying metal layer 20.

Removing Exposed Portions of First Underlying Metal Layer

Figure 1B:
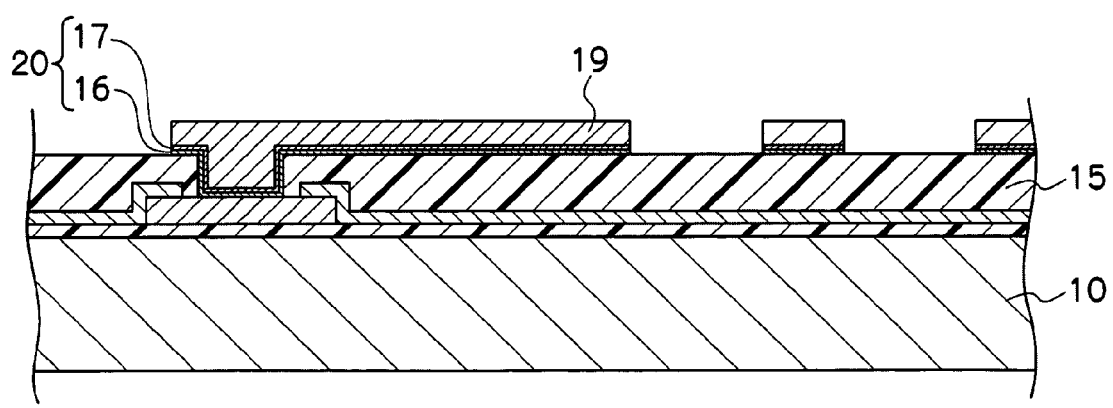

After exposing first underlying metal layer 20, exposed portions of first underlying metal layer 20 are removed, as shown in FIG. 1B. Here, if first underlying metal layer 20 is exposed to an etching liquid, rewiring 19 is also exposed to the etching liquid at the same time. Since the column electrode is not present, the flow of the etching liquid is not non-uniform, and exposed underlying metal layer 20 is etched without irregularities at each location thereof.

Thus, even if rewiring 19 is etched, each location thereof is etched evenly. As a result, it is possible to satisfy allowable values of irregularity in the shape of the rewiring.

First underlying metal layer 20 of the present invention may include only underlying metal adhesive layer 16. However, it is preferable to form underlying metal antioxidant layer 17 on underlying metal adhesive layer 16 to prevent underlying metal adhesive layer 16 from oxidizing. If underlying metal layer 20 is formed only of underlying metal adhesive layer 16, since, as described above, underlying metal adhesive layer 16 usually includes Ti as a main component, it readily oxidizes. As a result, if a column electrode is formed following oxidation, the column electrode and the oxidized underlying metal adhesive layer readily separate. On the other hand, oxidizing can be prevented by the inclusion of underlying metal antioxidant layer 17.

As underlying metal antioxidant layer 17, in addition to Cu given as an example previously, it is preferable to use metals that do not readily oxidize, such as Au, Pd, Pt and the like. As an etching liquid of underlying metal antioxidant layer 17, a sulfuric acid solution may be used, and as an etching liquid of first underlying metal adhesive layer 16, hydrogen peroxide solution may be used.

Laminating Second Underlying Metal Layer on Rewiring and Insulation Layer

Figure 1C:
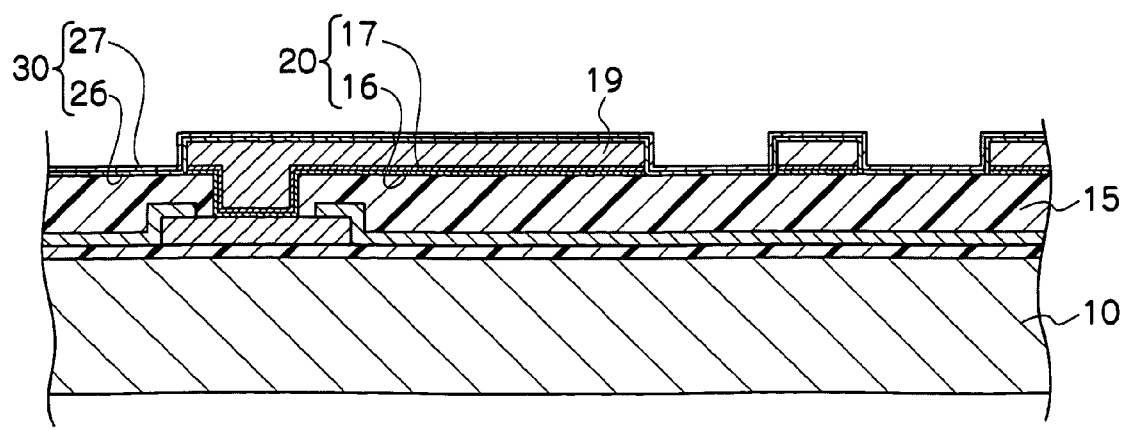

In the semiconductor device manufacturing method of the present invention, after removing the exposed portions of first underlying metal layer, a second underlying metal layer 30 is formed by sputtering or the like on insulation layer 15 and rewiring 19 as shown in FIG. 1C.

Second underlying metal layer 30 not only functions as a common electrode for column electrode 22 described below, but also suppresses erosion due to etching of rewiring 19 when etching second underlying metal layer 30.

Second underlying metal layer 30 preferably includes Ti as a main component, which is effective for removing portions of a second underlying metal layer, described below, without erosion of rewiring 19. Similar to first underlying metal layer 20, it is preferable for second underlying metal adhesive layer 26 and second underlying metal antioxidant layer 27 to be laminated sequentially. In this case it is preferable to use a metal with Ti as a main component for second underlying metal adhesive layer 26, and a metal that does not oxidize readily, such as Cu, Au, Pd, Pt or the like, as a main component for second underlying metal antioxidant layer 27. This is so that these layers may be formed with a similar structure to first underlying metal layer 20, and so that second underlying metal antioxidant layer 27 can prevent second underlying metal adhesive layer 26 from oxidizing. The film thickness of underlying metal layer 30 is similar to underlying metal layer 20.

Forming Column Electrode on Rewiring via Second Underlying Metal Layer

Figure 2A:
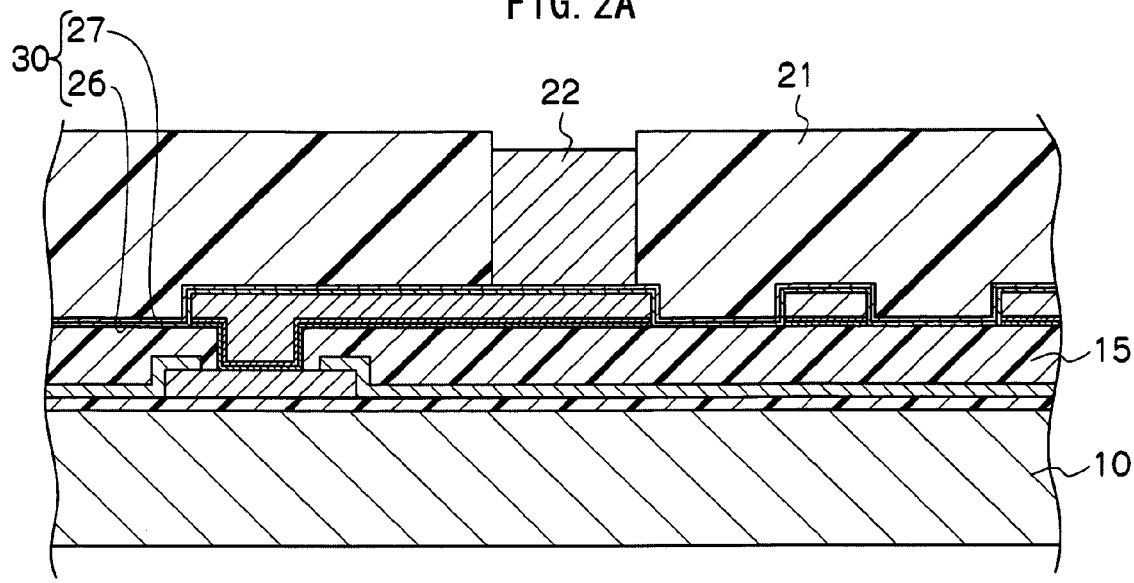
FIGS. 2A-2C are sectional views of processes from a process of forming a column electrode to a process of forming a second underlying metal layer in the semiconductor device manufacturing method according to the first embodiment of the present invention.

As shown in FIG. 2A, after forming photosensitive resin layer 21 on second underlying metal layer 30, pattern exposure and developing are performed so that a hole is opened only at a portion where column electrode 22 is formed. Next, a column electrode is electrodeposited by electroplating, taking second underlying metal layer 30 as a common electrode. As a result, column electrode 22 is formed on second underlying metal layer 30, but since second underlying metal layer 30 is formed mainly of Cu, Ti, or the like, it does not substantially increase electrical resistance between rewiring 19 and column electrode 22.

Column electrode 22 may be formed of Cu, Al, W, or the like. Second underlying metal layer 30 is preferably laminated to an extent that a column electrode may be formed by electroplating. In other words, on a wafer, it is preferable to form second underlying metal layer 30 as a layer such that it does not break as a result of the formation of a step around the periphery of respective semiconductor devices, when providing a street for dicing a wafer into pieces (chips). Since column electrode 22 is formed by electroplating by applying a voltage from an end of the substrate, if the layer is split, a desired current will not flow near a central portion of the substrate, which can cause electroplating deficiencies. In order to suppress electroplating deficiencies, the total film thickness of underlying metal adhesive layer 16 and underlying metal antioxidant layer 17 is particularly preferably from around 0.4 μm to around 1 μm. This film thickness can be measured by observing a cross-section of the semiconductor device.

Etching Exposed Portions of Second Underlying Metal Layer

Figure 2B:
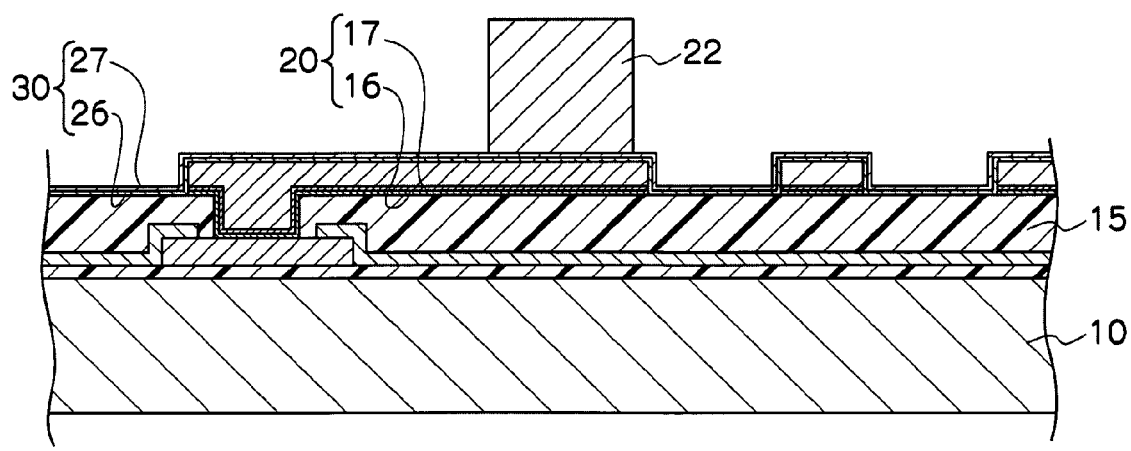
Figure 2C:
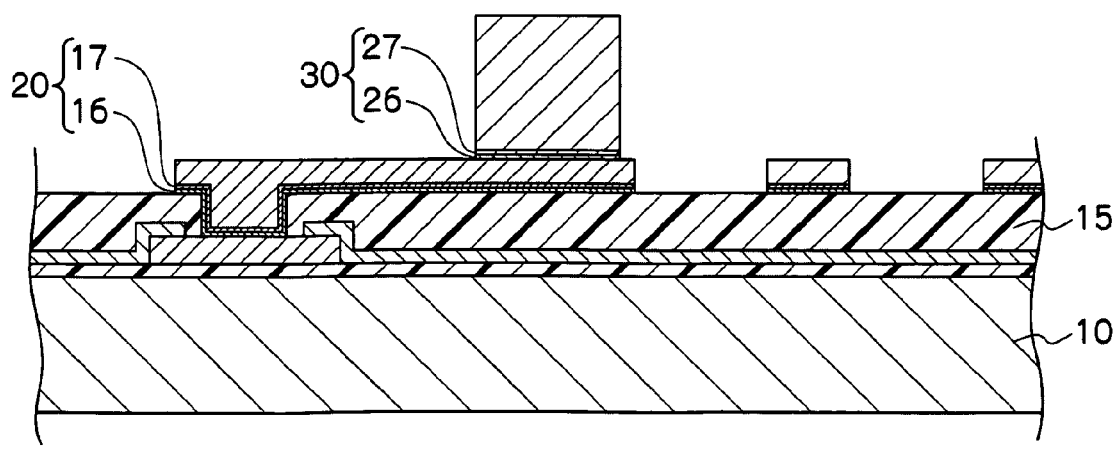

Next, after photosensitive resin layer 21 is removed by a removing solution or the like as shown in FIG. 2B, exposed portions of second underlying metal layer 30 are removed as shown in FIG. 2C. First, exposed portions of second underlying metal antioxidant layer 27 are removed by wet etching. Next, exposed portions of second underlying metal adhesive layer 26 are removed. At this time, since column electrode 22 is present, the flow of etching liquid is irregular in the vicinity of column electrode 22.

However, in the present invention, since the etching liquid used to remove portions of second underlying metal antioxidant layer 27 exhibits a large in etching selectivity between second underlying metal antioxidant layer 27 and rewiring 19, rewiring 19 is not removed.

Therefore, when removing portions of second underlying metal antioxidant layer 27, no matter how much it is over-exposed to etching liquid, there is no erosion of rewiring 19 compared to a conventional case. As a result, rewiring 19 can satisfy allowable values.

Figure 3:
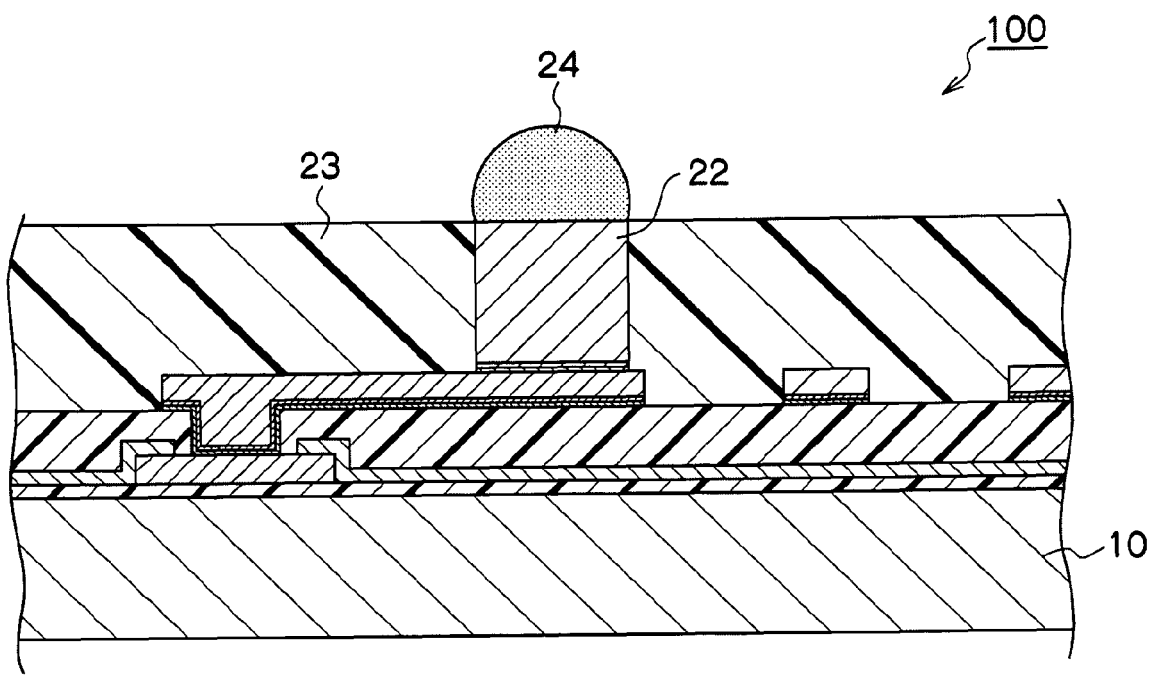
FIG. 3 is a sectional view of a process of forming a soldering electrode of the semiconductor device manufacturing method according to the first embodiment of the present invention.

Finally, as shown in FIG. 3, the entire surface is covered with a sealing resin 23, the surface of column electrode 22 is exposed by a cutting process, CMP or the like, and connected to a soldering electrode 24 by a soldering ball or the like by a reflow process. Subsequently, semiconductor device 100 on the substrate is diced into pieces with a dicing saw to manufacture respective semiconductor devices.

Second Embodiment

The semiconductor device manufacturing method according to the second embodiment of the present invention includes: preparing a substrate; laminating an insulation layer on the substrate; sequentially laminating an underlying metal adhesive layer and an underlying metal antioxidant layer on the insulation layer; forming rewiring on the underlying metal antioxidant layer; removing exposed portions of the underlying metal antioxidant layer; forming a column electrode on the rewiring, and removing exposed portions of the underlying metal adhesive layer. Each of the above processes is explained below with reference to FIGS. 4-6.

Figure 4A:
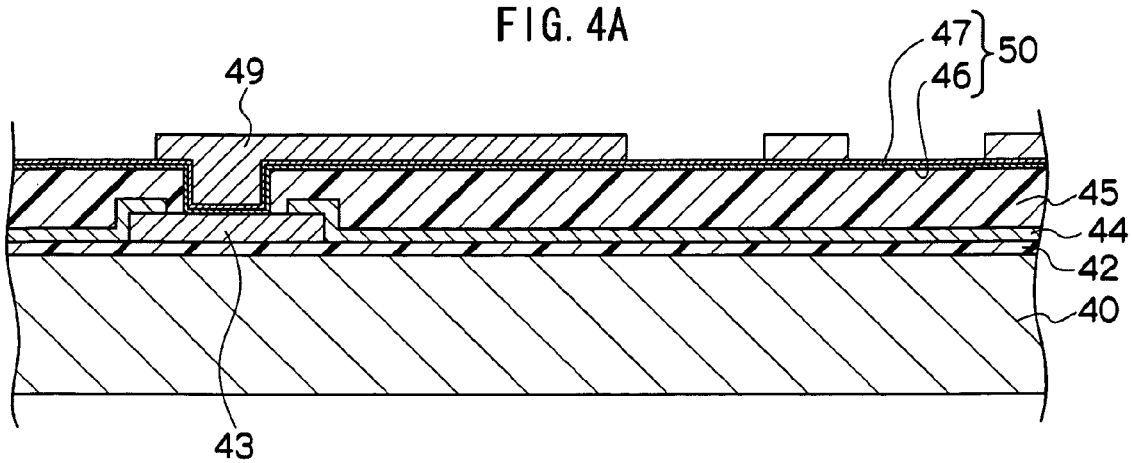
FIGS. 4A-4C are sectional views of processes from a process of forming rewiring to a process of forming a column electrode, in the semiconductor device manufacturing method according to the second embodiment of the present invention.

From Preparing Substrate to Forming Rewiring on Underlying Metal Antioxidant Layer In the semiconductor device manufacturing method of the second embodiment of the present invention, rewiring 49 similar to that shown in FIG. 4A is formed in a similar manner to that shown in FIGS. 7A-7C. First, similar to as shown in FIG. 7A, a semiconductor substrate 40 formed with an insulation layer 42 is prepared. An electrode pad 43 is formed on insulation layer 42. After forming surface protection film 44 and insulation layer 45 (interlayer insulation film), a through hole is opened above electrode pad 43.

Next, similar to as shown in FIG. 7B, above electrode pad 43 and on the surface of insulation layer 45, underlying metal adhesive layer 46, formed of Ti or the like, and underlying metal antioxidant layer 47, formed of Cu or the like are sequentially laminated by a sputter method or the like.

Subsequently, similar to as shown in FIG. 7C, a photosensitive resin layer is covered over the entire surface, and a developing process for pattern-forming and pattern-opening of the photosensitive resin layer is performed, forming a pattern of photosensitive resin film 48.

Next, taking underlying metal antioxidant layer 47 as a common electrode, copper is electrodeposited in an electroplating method to form rewiring 49 which extends from electrode pad 43 to a portion forming a copper column electrode (described below). Then, as shown in FIG. 4A, a photosensitive resin film is removed to expose underlying metal layer 50.

Removing Exposed Portions of the Underlying Metal Antioxidant Layer

Figure 4B:
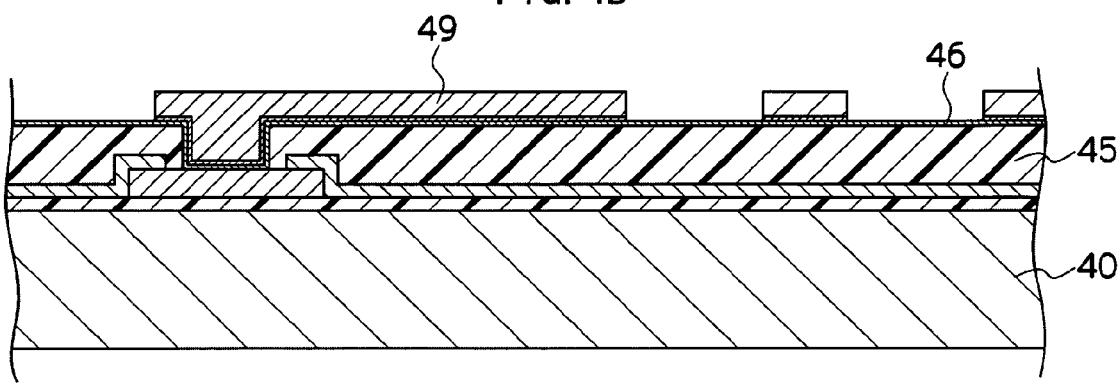

In the semiconductor device manufacturing method according to the second embodiment of the present invention, after exposing underlying metal layer 50, exposed portions of underlying metal antioxidant layer 47 are removed as shown in FIG. 4B. In this manner, similar to the first embodiment, since an etching liquid is used in the removal of underlying metal antioxidant layer 47 before forming a column electrode 52 (described below), the flow of etching liquid is uniform, and the occurrence of residual portions of underlying metal antioxidant layer 47 can be suppressed. In this process, only underlying metal antioxidant layer 47 is etched so that a column electrode can be formed with underlying metal adhesive layer 46 as a common electrode thereof. Since underlying metal adhesive layer 46 functions as a common electrode for a column electrode formed by electroplating, underlying metal adhesive layer 46 and underlying metal antioxidant layer 47 are preferably configured such that the column electrode described below can be formed by electroplating. Similarly, since exposed portions of underlying metal antioxidant layer 47 are removed just before forming the column electrode, it is preferable that underlying metal adhesive layer 46 is laminated to an extent such that a column electrode may be formed thereon by an electroplating method.

The above description "underlying metal adhesive layer 46 is laminated to an extent such that a column electrode may be formed by an electroplating method" means specifically that underlying metal adhesive layer 46 is formed as a layer such that it does not break as a result of the formation of a step around the periphery of respective semiconductor devices when providing a street for dicing a wafer into pieces (chips). Since column electrode 52 is formed by electroplating by applying a voltage from the end of the substrate, if the layer is split, a desired current will not flow near a central portion of the substrate, which can cause electroplating deficiencies. In order to suppress electroplating deficiencies, the total film thickness of underlying metal adhesive layer 46 and underlying metal antioxidant layer 47 is particularly preferably from around 0.4 μm to around 1 μm. If the film thickness is less than around 0.4 μm, a fault may occur in the underlying metal adhesive layer near an end portion of the wafer. If the thickness is greater than around 1.0 μm, it becomes difficult to reduce manufacturing time. Further, a lot of time is spent on removing underlying metal adhesive layer 46 by etching. The film thickness can be measured by observing a cross-section of the semiconductor device.

In the semiconductor device manufacturing method according to the second embodiment, underlying metal adhesive layer 46 and underlying metal antioxidant layer 47 are necessary elements, and are respectively different materials. Regarding these materials, as described above, a metal with Ti as a main element may be used for underlying metal adhesive layer 46, and underlying metal antioxidant layer 47 may be formed of, Au, Pt, Pd or the like, in addition to Cu.

Forming Column Electrode on Rewiring; Etching Underlying Metal Adhesive Layer

Figure 4C:
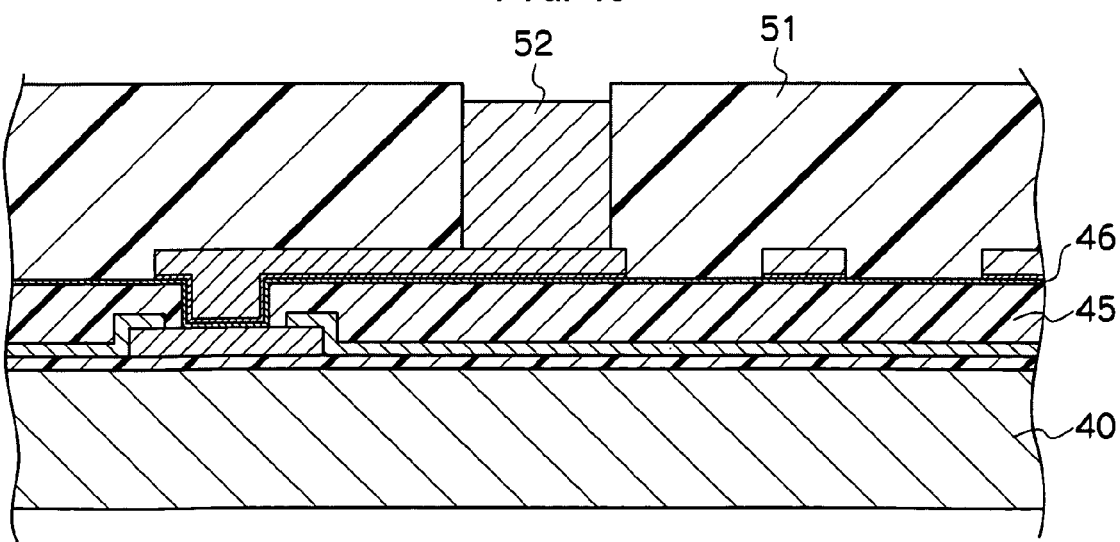
Figure 5A:
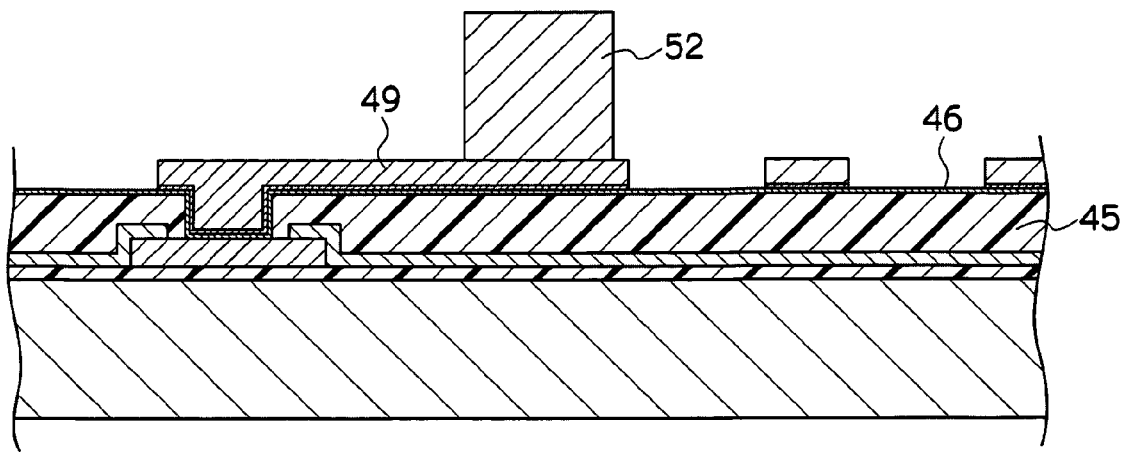
FIGS. 5A and 5B are sectional views of processes of removing a photosensitive resin layer and etching an underlying metal adhesive layer in the semiconductor device manufacturing method according to the second embodiment of the present invention.
Figure 5B:
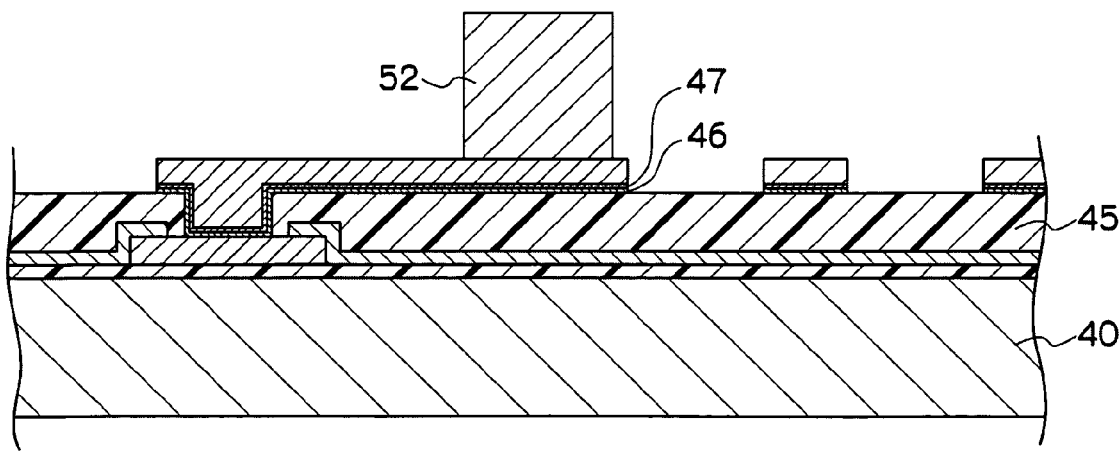

As shown in FIG. 4C, a column electrode is formed in the same way as in FIG. 2A. Subsequently, as shown in FIG. 5A, photosensitive resin layer 51 is removed, and as shown in FIG. 5B, exposed portions of underlying metal antioxidant layer 47 are removed by wet etching. At this time, since column electrode 52 is present, when etching liquid flows, it is not uniform in the vicinity of column electrode 52. However, in the present invention, since the etching liquid used to remove portions of second underlying metal adhesive layer 46 exhibits a large difference in etching selectivity between underlying metal adhesive layer 46 and rewiring 49, rewiring 49 is not removed.

Therefore, when removing second underlying metal adhesive layer 46, no matter how much it is over-exposed to etching liquid, there is no erosion of rewiring 19. As a result, rewiring 19 can satisfy allowable values.

Figure 6:
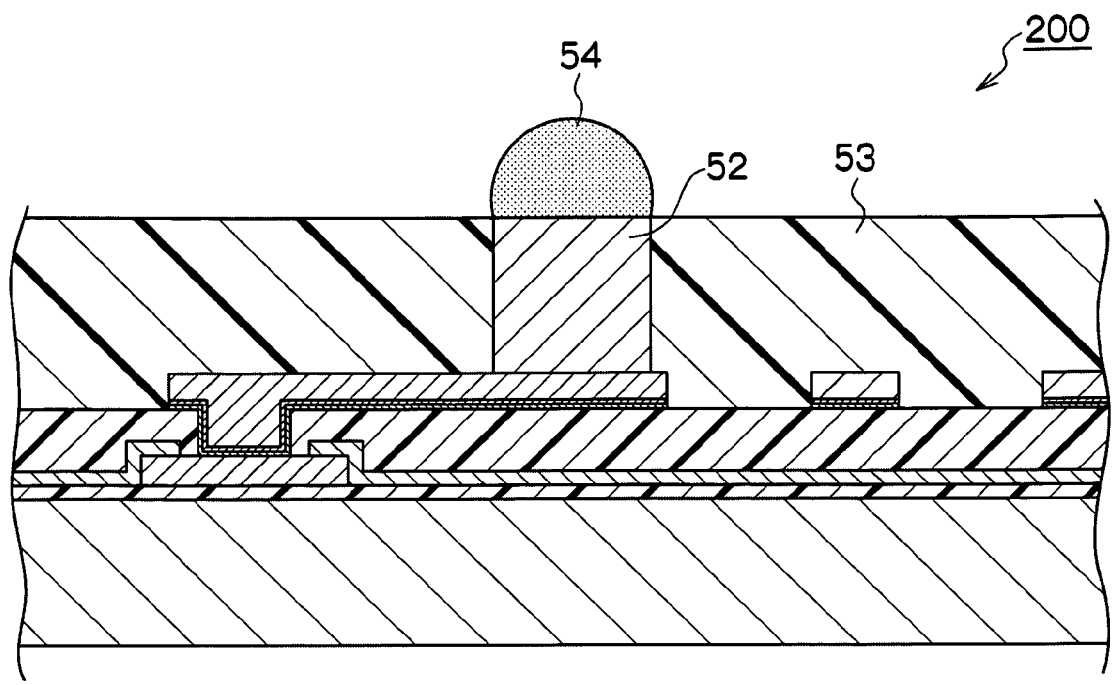
FIG. 6 is a sectional view of a process of forming a soldering electrode of the semiconductor device manufacturing method according to the second embodiment of the present invention

Finally, as shown in FIG. 6, semiconductor device 200 on a substrate, similar to that shown in FIG. 3, is diced into pieces with a dicing saw to manufacture respective semiconductor devices.

The present embodiment should not be interpreted as limiting, and the present invention can be implemented within a scope that satisfies the main conditions thereof.

What is claimed is:

1. A semiconductor device manufacturing method, comprising:
   preparing a substrate;
   laminating an insulation layer on the substrate;
   laminating a first underlying metal layer on the insulation layer;
   forming rewiring on the first underlying metal layer;
   removing exposed portions of the first underlying metal layer;
   laminating a second underlying metal layer on the rewiring and the insulation layer, the second underlying metal layer comprising an underlying metal adhesive layer and an underlying metal antioxidant layer;
   forming a column electrode on the rewiring via the second underlying metal layer; and
   removing exposed portions of the second underlying metal layer.

2. The semiconductor device manufacturing method of claim 1, wherein the first underlying metal layer comprises a further underlying metal adhesive layer and a further underlying metal antioxidant layer.

3. The semiconductor device manufacturing method of claim 1, wherein the second underlying metal layer is laminated to an extent that the column electrode can be formed by electroplating.

4. The semiconductor device manufacturing method of claim 1, wherein the thickness of the second underlying metal layer is from 0.4 μm to 1.0 μm.

5. A semiconductor device manufacturing method, comprising:
   preparing a substrate;
   laminating an insulation layer on the substrate;
   sequentially laminating an underlying metal adhesive layer and an underlying metal antioxidant layer on the insulation layer;
   forming rewiring on the underlying metal antioxidant layer;
   removing exposed portions of the underlying metal antioxidant layer;
   after the exposed portions of the underlying metal antioxidant layer are removed, forming a column electrode on the rewiring; and
   removing exposed portions of the underlying metal adhesive layer.

6. The semiconductor device manufacturing method of claim 5, wherein the underlying metal adhesive layer is laminated to an extent that the column electrode can be formed by electroplating.

7. The semiconductor device manufacturing method of claim 5, wherein the thickness of the underlying metal adhesive layer is from 0.4 μm to 1.0 μm.

8. The semiconductor device manufacturing method of claim 5, wherein the exposed portions of the underlying metal adhesive layer are removed after the column electrode is formed on the rewiring.

* * * * *